United States Patent [19]

Chan et al.

[11] Patent Number: 4,826,069

[45] Date of Patent: May 2, 1989

[54] WORK CHUCK FOR WIRE BONDER AND METHOD

[75] Inventors: Lo K. Chan; Yui Cheung, both of Kwai Chung, Hong Kong

[73] Assignee: ASM Assembly Automation, LTD., Hong Kong

[21] Appl. No.: 170,542

[22] Filed: Mar. 21, 1988

[51] Int. Cl.$^4$ .............................................. B23K 31/00
[52] U.S. Cl. ...................................... 228/103; 228/4.5
[58] Field of Search .................... 228/1, 4.5, 8, 9, 103, 228/110

[56] References Cited

U.S. PATENT DOCUMENTS

| | | | |
|---|---|---|---|
| 3,709,422 | 1/1973 | Diepeveen | 228/4.5 |
| 3,894,672 | 7/1975 | Arai et al. | 228/4.5 |
| 4,239,144 | 12/1980 | Elles et al. | 228/4.5 |
| 4,759,073 | 7/1988 | Shah et al. | 228/103 |

*Primary Examiner*—M. Jordan
*Attorney, Agent, or Firm*—Harry M. Weiss

[57] ABSTRACT

An apparatus and method for making high-speed wire bonds between a semiconductor chip and a chip carrier. A chuck supported on a pushrod passing through a rotating sleeve holds the chip and provides Z- and theta- motions, while the bonding head provides X- and Y- movements relative to the chip. Limiting the bonding head to X- and Y- motions significantly reduces the dynamic forces on the bonding head and supporting mechanism, thereby enabling a faster rate of reliable operation. A signal source directly contacts the pushrod to provide reference signals to control circuitry regarding the position of the anvil and chip supported thereon.

6 Claims, 2 Drawing Sheets

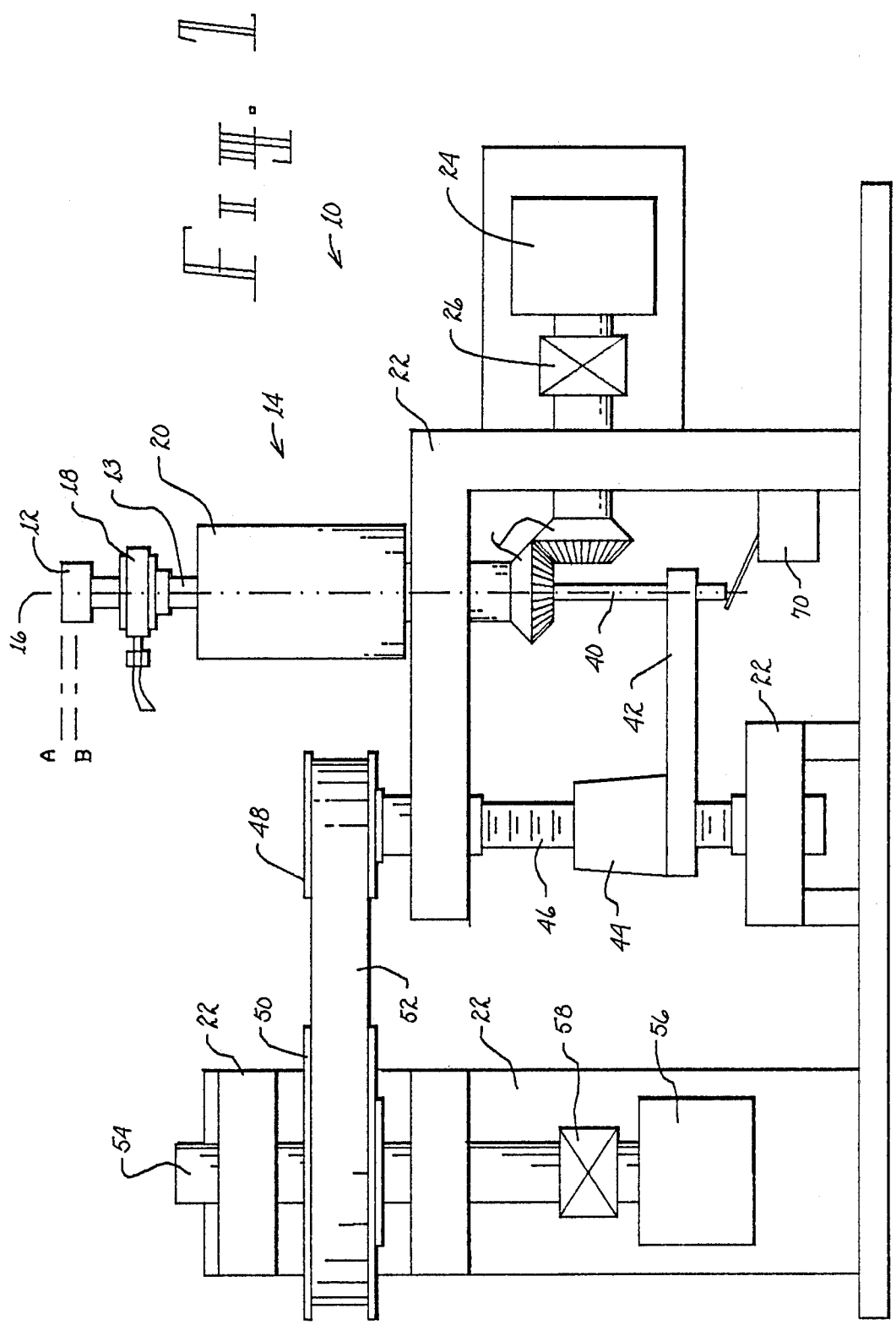

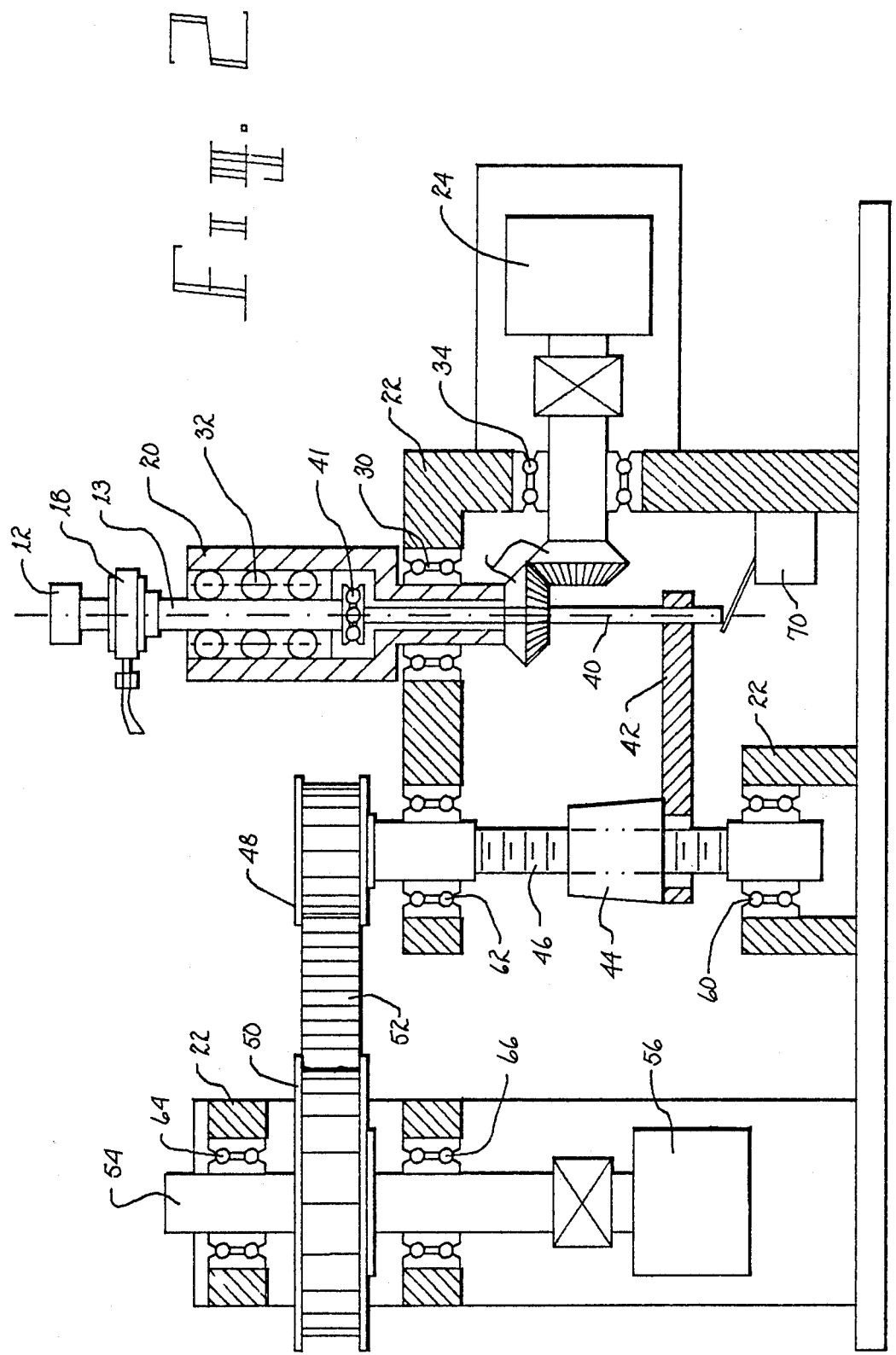

WORK CHUCK FOR WIRE BONDER AND METHOD

BACKGROUND OF THE INVENTION

1. Field of the Invention

This invention relates to the electronics industry, and, more specifically, to an apparatus and method for making quick, precise wire bonds between a micro-chip and a chip carrier.

2. Description of the Prior Art

In the past, semiconducter microprocessors and other micro-chips have been widely used. These micro devices provided powerful functions in tiny packages.

To enable such a chip to communicate with its environment, it was necessary to electrically inter-connect the chip to the surrounding circuitry. Initially, the electrical connections were effected by welding, or bonding, fine wires by hand with the aid of a microscope. The wires were connected to bonding pads on the chip and to leads on a chip carrier. The flexibility of a human operator allowed the bonds to made at any X-, Y- or Z-position, as well as in any theta angular orientation with respect to the surface of the chip. The travel in the X- and Y-directions defined the lateral position of the bond. The travel about the theta-axis aligned the bonding-wire feed axis with the desired path. The travel in the Z-direction primarily provided the contact between the bonding wire and the desired bonding site, but also provided sufficient motion to allow for variations in the elevations of the respective bonding pads. However, due to the diminutive character of the chip and the high degree of precision required, the bonding process was slow.

Subsequently, wire bonding machines were developed. These wire bonding machines utilized a chip holder and a bonding head. The chip holder typically held the chip with vacuum. The bonding head provided a bonding-wire feed and a transducer, which effected the actual bond. Wire-tear devices were incorporated into the bonding head to shear the bonding wire following the completion of a particular interconnection. Optical targeting systems were also mounted on the bonding head to precisely align the head with respect to the chip prior to bonding. Where significant height differences along the Z-axis existed between the various bonding sites, it was necessary to provide the optical targeting system with an additional focusing mechanism.

In some wire bonding machines, the chip holder moved in the X-, Y- and theta-directions, and the bonding head provided the Z-motion.

In other wire bonding machines, the chip holder moved in the theta-direction, and the bonding head provided the X-, Y- and Z-motions.

In still other wire bonding machines, the chip holder moved in the X-, Y-directions, while the bonding head provided the Z- and theta-motions.

In yet other wire bonding machines, the chip holder moved in only in the Z-direction, and the bonding head provided the X-, Y- and theta-motions.

U.S. Pat. No. 4,619,395 shows a workstation for holding a chip that provides both Z- and theta-motions for the chip. The disclosed device shows a chip holder pedestal rotatably mounted in a sliding support frame.

While the chip holders, or workstations, utilized in wire bonders of the past worked, a problem persisted. The chip holders of the past which did provide Z- and theta-motions for the chip did not affirmatively provide a directly coupled source of reference signals indicating the Z-position of the chip. A need existed for a wire bonder which eliminated Z- or theta-motions for the bonding head to thereby reduce the mass and interia of rotation of the bonding head and thereby allow an increased rate of operation, while affirmatively providing a directly coupled source of reference signals indicating the Z-position of the chip.

BRIEF DESCRIPTION OF THE DRAWING

FIG. 1 is an elevational view of a vacuum work chuck for a wire bonder.

FIG. 2 is a sectional elevational view of the vacuum work chuck of FIG. 1, with portions of the structure removed to display the internal structure of the device.

SUMMARY OF THE INVENTION

It is an object of this invention to provide an improved work chuck for a wire bonder.

It is an other object of this invention to provide an improved work chuck for a wire bonder which efficiently allows for high speed bonding movement.

It is a further object of this invention to provide an improved work chuck for a wire bonder, which achieves an elevated degree of dynamic stability during high speed bonding.

It is yet another object of this invention to provide an improved work chuck for a wire bonder, which provides for the movement of a device to be bonded in the Z direction but which does not require a focusing mechanism for an optical targeting system mounted along the Z-axis on the bonder.

It is still another object of this invention to provide an improved work chuck for a wire bonder which allows the bond head to move only in the X- and Y-direction, and which allows the work chuck to move in the Z- and theta-directions, and which further affirmatively provides a directly coupled source of reference signals indicating the Z-position of the chip.

DESCRIPTION OF THE PREFERRED EMBODIMENTS

In accordance with one embodiment of this invention, a chuck for positioning a chip while bonding is disclosed, comprising: anvil means having an anvil for holding the chip; rotating means for rotating the anvil about an axis; the rotating means having a sleeve rotatably mounted about the axis in a fixed rotational relationship with the anvil; elevating means having a pushrod passing completely through the sleeve and aligned with the axis for shifting the anvil along the axis; control means having a signal source in contact with a lower extremity of the pushrod for providing reference signals.

In accordance with another embodiment of this invention, a method for positioning a chip in a wire bonding operation at a desired elevation and desired angular position is disclosed, comprising the steps of: supporting the chip on an anvil aligned about an axis; slidably coupling the anvil to a sleeve rotatably disposed about the axis; rotatably coupling the anvil to a pushrod lying within the sleeve and disposed about the axis; lifting the pushrod to elevate the anvil and the chip to the desired elevation; rotating the sleeve about the axis to orient the anvil and the chip at the desired angular position; and contacting a lower end of the pushrod with a signal source to provide reference signals.

The foregoing and other objects, features and advantages will be apparent from the following, more particular, description of the preferred embodiments of the invention, as illustrated in the accompanying drawings.

THE SPECIFICATION

FIG. 1 shows an elevational view of a work chuck assembly for positioning a semiconductor chip in a wire bonding apparatus at both a work plane A and a loading plane B. The work chuck assembly, identified generally by 10, includes a work anvil 12, supported by an anvil stem 13. The anvil stem 13 rests atop a shaft assembly 14. The anvil 12, anvil stem 13 and the shaft assembly 14 are axially arranged about an axis 16, which axis lies perpendicular to the work plane A and the loading plane B. A vacuum swivel 18 couples to the anvil stem 13 to conduct an externally supplied vacuum to the work anvil 12 to thereby hold the chip in position.

Sleeve 20 is rotatably mounted in frame 22 about the axis 16. A rotary-motion motor 24 connects through a flexible coupling 26 to a gearset 28. The gearset 28 drivably couples the sleeve 20 and the motor 24.

Pushrod 40 is aligned on the axis 16, and provides vertical support for the anvil stem 13. As more fully explained in conjuction with FIG. 2, the anvil stem 13 is mounted within sleeve 20 in a fixed rotational relationship while still remaining free to translate therein. A push bar 42 links the pushrod 40 to a nut 44. The nut 44 is threadedly mounted upon a lead screw 46. The lead screw 46 is drivably coupled to a driven sprocket 48, which in turn is driven by driving sprocket 50 through cogged belt 52. The driving sprocket 50 mounts upon shaft 54, and transmits rotation from translation motor 56 through flexible coupling 58.

FIG. 2 discloses an elevational view of the work chuck 10, including partial sections taken generally through the sleeve 20, the frame 22 and the push bar 42 as shown in FIG. 1.

A sleeve bearing 30 permits the sleeve 20 free rotation within the frame 22. The driven half of gearset 28 is fixed to the lower end of sleeve 20. The sleeve 20 mounts a linear slider bearing 32, which supports the anvil stem 13 in a fixed rotational relationship with respect to the gearset 28, while still allow freedom of movement for the anvil stem 13 along the axis 16. A swivel bearing 41 rotatably couples the anvil stem 13 and the pushrod 40 in a fixed linear relationship. The slider bearing 32 and the swivel bearing 41 operate in conjunction to establish a fixed rotational relationship between the sleeve 20 and the anvil stem 13, while still allowing the pushrod 40 to freely shift the anvil stem 13 along the axis 16 between the work plane A and the loading plane B independent of the rotary orientation of the sleeve 20. Gearset bearing 34 provides support for the driving half of the gearset 28.

Lead screw bearings 60, 62 rotatably support the lead screw 46 within the frame 22. Shaft bearings 64, 66 rotatably support the shaft 54 within the frame 22.

Thus the chuck 10 provides a chip-support having minimal rotational inertia about the axis 16 and minimal linear inertia along the axis 16, thereby allowing reliable of the chuck and cooperating bonder at high speeds.

A signal source 70 affirmatively contacts the end of the pushrod 40 to provide reference signals for control circuitry regarding the position of the anvil 12 along the axis 16.

In operation, a semiconductor chip is placed upon the anvil 12 of the work chuck 10, and retained thereon by vacuum by swivel 18 through passages in pushrod 40. Control circuitry then activates both rotary-motion motor 24 and translation motor 56 to commence the positioning of the anvil 12 and chip at the proper angular and elevational position for bonding to occur. Initially, as rotary-motion motor 24 operates, the gearset 28 rotates the sleeve 20 to provide a theta-motion. Rotation of the sleeve 20 correspondingly turns the slider bearing 32 and the anvil stem 13 to align the anvil 12 and chip in the calculated angular position.

The translation motor 56 thence continues to drive through the shaft 54, the driving sprocket 56, the belt 52, the driven sprocket 48, the lead screw 46, the nut 44, and the push bar 42, thereby lifting the pushrod 40 to translate the swivel bearing 41, the anvil stem 13, the anvil 12 and chip along the Z-axis to the working plane A. The signal source 70, acting through the pushrod 40, as well as the linked swivel bearing 41, and the anvil stem 13, provides reference signals regarding the position the anvil 12. An optical targeting system defines when the chip has arrived at the working plane A, obviating the need for a separate optical focusing arrangement. At the working plane A, a bond is effected by a bonding head upon the chip. The translation motor 56 then reverses, and driving through the same mechanism positively retracts the anvil 12. Depending upon whether the effected bonding weld is the first or the second of a pair, the anvil 12 either continues to shift to effect the extension of the bonding wire to the next bonding pad, or retracts sufficiently to break the bonding wire to complete the bonding operation.

Having completed, in conjunction with a bonding head, a wire bond, the chuck 10 is then prepared to continue with the next bonding operation.

While the invention has been particularly described with reference to the preferred embodiments thereof, it will be understood by those skilled in the art that the foregoing and other changes in form and detail may be made therein without departing from the spirit and scope of the invention.

We claim:

1. A method for positioning a chip in a wire bonding operation at a desired elevation and desired angular position, comprising the steps of:
   supporting said chip on an anvil aligned about an axis;
   slidably coupling said anvil to a sleeve rotatably disposed about said axis;
   rotatably coupling said anvil to a pushrod lying within said sleeve and disposed about said axis;
   lifting said pushrod to elevate said anvil and said chip to said desired elevation;
   rotating said sleeve about said axis to orient said anvil and said chip at said desired angular position; and
   contacting a lower end of said pushrod with a signal source to provide reference signals.

2. A chuck for positioning a chip while bonding, comprising:
   a. anvil means having an anvil for holding said chip;
   b. rotating means for rotating said anvil about an axis;
   c. said rotating means having a sleeve rotatably mounted about said axis in a fixed rotational relationship with said anvil;
   d. elevating means having a pushrod passing completely through said sleeve and aligned with said axis for shifting said anvil along said axis;

e. control means having a signal source in contact with a lower extremity of said pushrod for providing reference signals.

3. A chuck in accord with claim 2, wherein said elevating means further includes swivel means for linking said anvil means and said pushrod along said axis in relative rotational freedom.

4. A chuck in accord with claim 3, wherein said rotating means further includes linear bearing means for permitting said anvil to translate along said axis within said sleeve.

5. A chuck in accord with claim 4, wherein said elevating means further includes a lead screw having a nut fixedly coupled to said pushrod.

6. A chuck in accord with claim 5, wherein said anvil means further includes vacuum means for adhering said chip to said anvil means.

* * * * *